United States Patent
Valette

(10) Patent No.: US 7,022,249 B2
(45) Date of Patent: Apr. 4, 2006

(54) METHOD FOR MAKING AN OPTICAL MICROMIRROR AND MICROMIRROR OR ARRAY OF MICROMIRRORS OBTAINED BY SAID METHOD

(75) Inventor: Serge Valette, Grenoble (FR)

(73) Assignee: Teem Photonics, Meylan (FR)

( * ) Notice: Subject to any disclaimer, the term of this patent is extended or adjusted under 35 U.S.C. 154(b) by 39 days.

(21) Appl. No.: 10/467,174

(22) PCT Filed: Feb. 13, 2002

(86) PCT No.: PCT/FR02/00546

§ 371 (c)(1),
(2), (4) Date: Aug. 14, 2003

(87) PCT Pub. No.: WO02/065187

PCT Pub. Date: Aug. 22, 2002

(65) Prior Publication Data

US 2004/0085606 A1    May 6, 2004

(30) Foreign Application Priority Data

Feb. 15, 2001 (FR) .................................. 01 02067

(51) Int. Cl.
*B29D 11/00* (2006.01)
*H01L 21/00* (2006.01)

(52) U.S. Cl. ............................. 216/24; 216/2; 216/26; 359/291

(58) Field of Classification Search ................... 216/2, 216/24, 26; 359/291
See application file for complete search history.

(56) References Cited

U.S. PATENT DOCUMENTS

| | | | |
|---|---|---|---|
| 3,886,310 A | 5/1975 | Guldberg et al. | |
| 4,592,628 A | 6/1986 | Altman et al. | |
| 5,485,304 A * | 1/1996 | Kaeriyama | 359/291 |
| 5,677,785 A * | 10/1997 | Koo et al. | 359/291 |
| 5,867,302 A | 2/1999 | Fleming | |
| 5,936,760 A * | 8/1999 | Choi et al. | 359/298 |
| 6,124,158 A * | 9/2000 | Dautartas et al. | 438/216 |
| 6,134,042 A | 10/2000 | Dhuler et al. | |
| 6,706,202 B1 * | 3/2004 | Sun et al. | 216/24 |

FOREIGN PATENT DOCUMENTS

| | | |
|---|---|---|
| DE | 198 57 946 | 1/2000 |
| EP | 0 834 759 | 4/1998 |

* cited by examiner

OTHER PUBLICATIONS

K.E. Petersen: "Silicon torsional scanning mirror" IBM Journal of Research and Development, vol. 24, No. 5, pp. 631-637 Sep. 1, 1980.

*Primary Examiner*—Shamim Ahmed
(74) *Attorney, Agent, or Firm*—Oblon, Spivak, McClelland, Maier & Neustadt, P.C.

(57) ABSTRACT

A method for manufacturing an optical micro-mirror including a fixed part and a moveable part, with a reflection device connected to the fixed part by an articulation mechanism. This method realizes a stack including a mechanical substrate, a first layer of thermal oxidation material, and at least one second layer of material for forming the moveable part, realizes the articulation mechanism, realizes the reflection device on the second layer, realizes the moveable part by etching of at least the second layer of material, and eliminates the thermal oxidation layer to liberate the moveable part. Such an optical micro-mirror may find possible applications to optical routing or image projection systems.

29 Claims, 17 Drawing Sheets

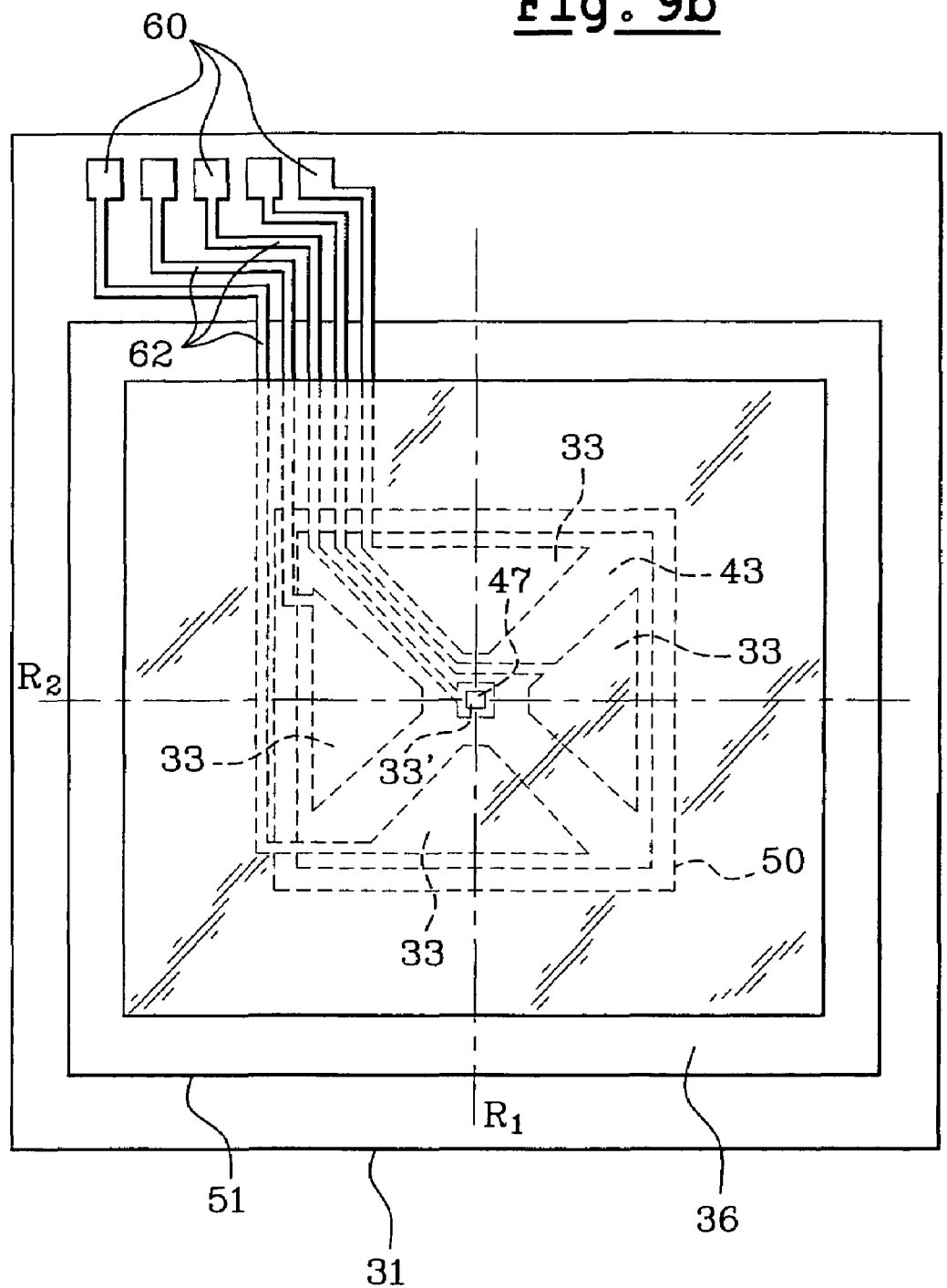

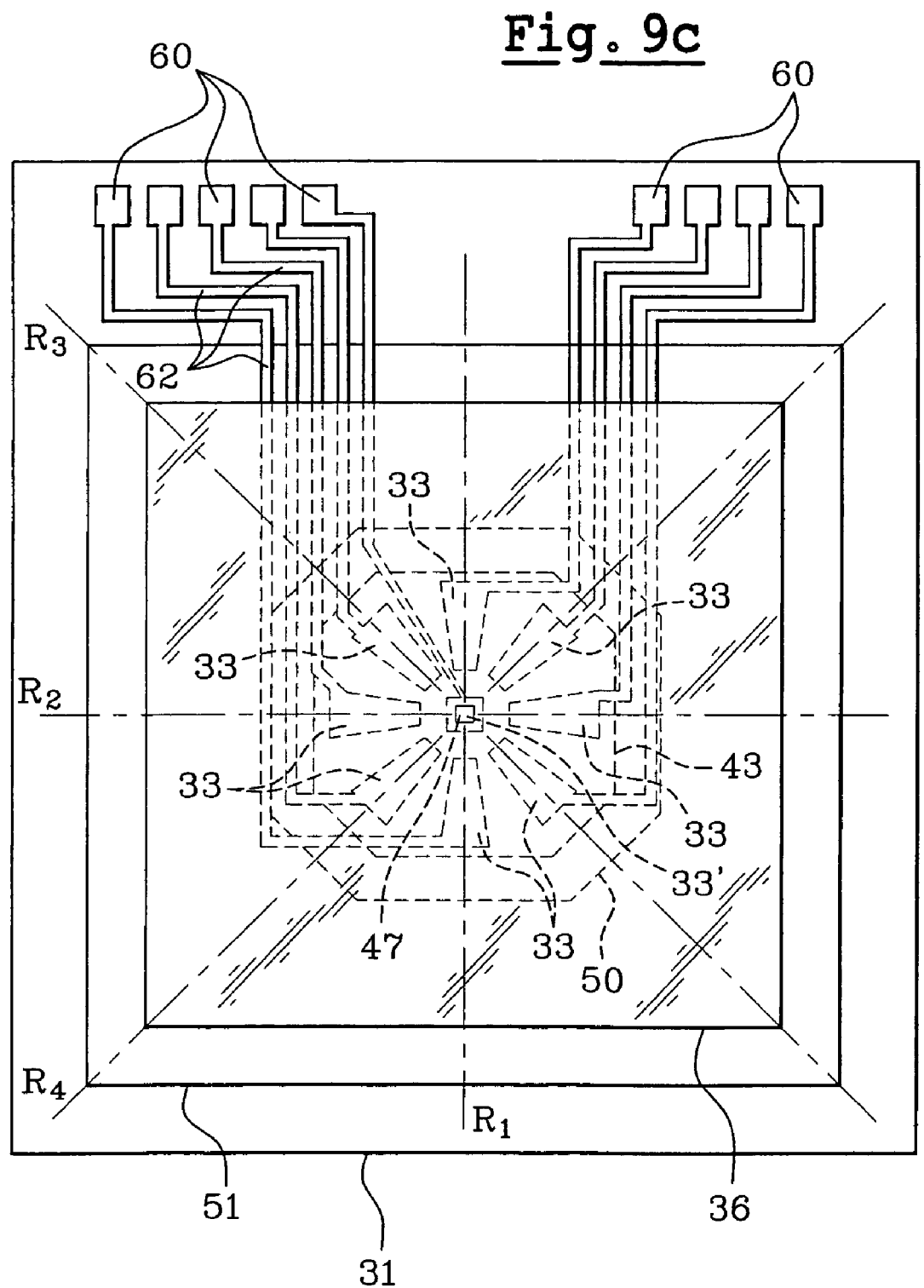

METHOD FOR MAKING AN OPTICAL MICROMIRROR AND MICROMIRROR OR ARRAY OF MICROMIRRORS OBTAINED BY SAID METHOD

FIELD OF THE INVENTION

The invention relates to a method for manufacturing an optical micro-mirror and a micro-mirror or array of micro-mirrors obtained by the method of the invention. These micro-mirrors are capable of being electrically controlled.

Micro-mirrors are used generally in systems implementing deflections of light beams and in particular in optical routing systems or in image projection systems.

BACKGROUND OF THE INVENTION

Electrically controlled micro-mirrors (most often using electrostatic, electromagnetic, piezoelectric, or thermoelastic forces) capable of generating digital or analog angular positions are known in the literature. They generally use hinge configurations making it possible, according to the complexity of the technological steps employed, to oscillate around an axis (simple hinge) or around two axes (double hinge) of rotation oriented most frequently orthogonally.

FIG. 1a represents a view of such an electrostatically controlled micro-mirror enabling rotation on 2 perpendicular axes, utilized in optical routing systems. The fixed frame 2 of the micro-mirror and the movable parts 3 and 4 articulated, respectively, around hinges 5 and 6 that enable the desired rotations about the two orthogonal axes are made on the substrate 1. Each axis of rotation passes through a distinct hinge. The moveable part 4 is covered with a high-reflectivity layer.

FIG. 1b represents a highly diagrammatic cross-sectional view of the different elements forming this type of micro-mirror (section along the axis of the hinge 5). In addition, in this Figure the different control electrodes 7, 8, 9 and 10 of the micro-mirror are represented. The opposing electrodes 7 and 8 make it possible to turn the moveable part 3 about the axis 5, which the opposing electrodes 9 and 10 make it possible to turn the moveable part about the axis 6.

The manufacturing steps comprise, starting with a mechanical substrate, a sequence of deposits and etchings of suitable material enabling the realization of the different elements of the micro-mirror or micro-mirrors (control electrodes, moveable parts, hinges, etc.) and comprise the use of one or a plurality of sacrificial layers, removal of which makes it possible to liberate the moveable part(s).

There are many technological alternatives for obtaining such devices. In this respect, the references cited at the end of the description can be consulted.

Although in the detail of the structures and the sequences of technological steps implemented use a wide diversity of approaches, the devices developed today have the following points in common:

the materials used for producing the moveable part or parts of the micro-mirrors are, in the majority of cases, amorphous or polycrystalline (polycrystalline silicon, aluminum, various metals, etc.) deposited using very classical techniques (vacuum evaporation, cathodic sputtering, vapor phase deposition, CVD, etc.)

the materials used for producing the sacrificial layers can be of different types (silica, various organic materials, etc.) but are always obtained by deposition techniques (CVD, rotary deposition, cathodic sputtering, etc.) that generally do not afford very precise control of the thicknesses utilized (typically several tens of nanometers for micron thicknesses) but that have the advantage of being very flexible to use.

The drawbacks of the prior art approaches are at several levels:

First of all, unsatisfactory precision in angular excursion (typically between $10^{-1}$ and $10^{-2}$) as the result of the use of sacrificial layers produced by deposition techniques that do not have very high degrees of thickness control.

For certain system architectures, in particular those used for optical routing purposes, all of these points are prejudicial and none of the manufacturing methods proposed in the prior art makes it possible to overcomes them correctly.

Moreover, poor mechanical properties of the amorphous or polycrystalline layers of the thin layers constituting the moveable part(s) that translates inter alia into a greater fragility and deformation after clearing, which perturbs the planeity of the surface.

This point is particularly important in the case of high surface micro-mirrors (of the order of a square millimeter or a fraction of a square millimeter) which must carry out an image function demanding excellent quality of optical wave surface.

SUMMARY OF THE INVENTION

The object of the present invention is to provide a method for forming an optical micro-mirror as well as the optical micro-mirror or an array of micro-mirrors obtained according to the method of the invention and not having the drawbacks of the prior art.

In particular, the micro-mirror obtained according to the method of the invention has excellent angular excursion precision, while having satisfactory angular excursion. In addition, the moveable part of the micro-mirror obtained according to the method of the invention has mechanical properties that result in obtaining excellent planeity. The micro-mirror of the invention can also be a hinged micro-mirror (single or double) as well as a pivoting micro-mirror; this latter type of micro-mirror is original and can just be obtained in virtue of the method of the invention.

More precisely, the object of the invention is a method for manufacturing an optical micro-mirror comprising a fixed part, a moveable part connected to the fixed part by articulation means, the moveable part comprising in addition reflection means. This method comprises the following steps:

a) realization of a stack formed of a mechanical substrate, an sacrificial layer of a specific thickness of thermal oxidation material called the first layer and an assembly for forming the moveable part and comprising at least one layer of material called the second layer;

b) realization of the articulation means;

c) realization of the moveable part by etching of at least the second layer of material so as to obtain at least one pattern;

d) removal at least in part of the sacrificial layer so as to clear said moveable part that is then connected to the rest of the micro-mirror corresponding to the fixed part by means of the articulation means.

The steps of the method of the invention can be carried out in the aforesaid order or in a different order; moreover, in certain embodiments, certain steps can be included in other steps. According to the invention, the substrate or the layers are not strictly formed from a single material; thus, the substrate can comprise a plurality of layers and the layers can comprise a plurality of sub-layers.

According to the invention, the use of a layer of thermal oxidation material makes it possible to have a layer whose thickness is extremely well-controlled that serves as sacrificial layer. The value of the angular excursion of the moveable part can thus be very precise and reproducible; it can also of a significant level.

Advantageously, the sacrificial layer of thermal oxidation material has a thickness of greater than or equal to 1 micron.

In the case of a silicon substrate, for example, the method of the invention makes it possible to obtain layers of thermal silica with a precision of the order of several nanometers on total thicknesses of several microns or several tens of microns, approximately 10 times better than those obtained in the prior art regarding thicknesses of the sacrificial layers; the gain in angular precision resulting therefrom is also of the order of a factor of 10.

The thermal oxidation layer can be partially removed; it must be etched at least in order to make it possible to clear the moveable part.

Preferably, the reflector means are realized on the second layer by deposition of a monolayer or multiple layers of reflector material such as metals like gold, silver, aluminum, for example, or dielectrics of $SiO_2/TiO_2$ or $SiO_2/HFO_2$, for example; these materials are deposited, for example, by cathodic sputtering or vapor evaporation on the second layer, generally after step b).

If the second layer has sufficient reflectivity for the intended application, the reflector means are then realized on the second layer after epitaxy.

Advantageously, the method comprises in addition a step of epitaxy of the second layer, the reflector means being then realized using the second layer itself.

Epitaxy of the second layer makes possible an increase in the thickness of this layer with the best mechanical continuity possible and obtaining of a minimally deformable layer with high mechanical quality (namely mechanical strength) that conserves excellent planeity even after the step d) clearing step.

According to a preferred embodiment of the invention, the second layer is a layer of monocrystalline material. The use of monocrystalline material for the moveable part makes it possible to obtain high surface planeity on which the reflectivity layer is deposited.

According to a first embodiment of the invention, step a) comprises the realization of the thermal oxidation layer on the substrate, then the deposition of the second layer on the thermal oxidation layer.

Deposition is defined according to the invention as any type of deposition including the transfer of a layer.

For step a) either the different steps can be carried out or a wafer of semiconductor on insulator such as SOI commonly known as "Silicon on Insulator", which is commercially available, can be used. In the latter instance, by way of example, the SOI substrates can be used to advantage using a wafer of thermal silica (for example, the wafers sold under the trade name "Unibon" by the SOITEC company).

According to a second embodiment of the invention, step a) comprises the transfer onto the mechanical substrate of the second layer, the substrate and/or the second layer comprising on their surfaces to be coated a thermal oxidation layer that will form after the application of the first layer.

Advantageously, the transfer comprises a sealing step (of the substrate or of the oxide on the one hand and of the second layer or the oxide layer on the other hand) by molecular adhesion. A sealing element could also be used for this sealing such as an adhesive, for example.

The second layer can be combined with an intermediate substrate by a liaison zone capable of enabling the removal of the intermediate substrate after application or, in certain instances, prior to application.

According to a first use of this application, said liaison zone is an embrittlement zone obtained by ion implantation (see especially U.S. Pat. No. 5,374,564-U.S. Pat. No. 6,020,252) and/or by the creation of porosity in the second layer, removal of the intermediate substrate is done along this embrittlement zone by an appropriate treatment such as the application of mechanical force and/or the utilization of a thermal treatment.

According to a second use of this transfer, this liaison zone is a sacrificial layer that is subjected to chemical attack in order to enable removal of the intermediate substrate.

The transfer technique used in this second embodiment makes possible the use of at least two wafers advantageously assembled using molecular adhesion techniques and also makes it possible to overcome the limitations of angular excursion without sacrificing precision relative to the thickness of the sacrificial layer(s) (which sets the conditions largely for the precision regarding angular excursion).

It also makes it possible to have a greater freedom for the realization of complex structures without sacrificing the fundamental advantages offered by the invention (mechanical quality of the moveable parts and precision of the angular excursions).

The thermal oxide layer is carried out preferably by high-temperature oxidation under dry atmosphere (between 800° C. and 1,100° C. under oxygen) or under humid atmosphere (between 800° C. and 1,100° C. under water vapor) and at atmospheric pressure or under high pressure.

According to one advantageous method for realizing the articulation means of the invention, before step d), local etching of the layer(s) disposed on top of the substrate is done so as to form at least one via and epitaxy is across each via, the epitaxial material in each via forming all or part of an articulation element of the articulation means.

The articulation elements can be produced respectively in several parts, especially in the case of the second embodiment using the transfer of the second layer. Thus, the articulation means of the invention are realized by:

local etching prior to application in such a fashion as to form at least one first via in the layer or layers disposed on top of the substrate and in such a fashion as to form at least one second via in the layer or layers disposed on the second layer, opposite to the substrate;

epitaxy through the first via forming one part of an articulation element and epitaxy in the second via forming another part of the articulation element, these two parts being brought into opposition during the transfer and forming an articulation element after the transfer.

According to a first embodiment of the articulation means of a micro-mirror, a single articulation element is realized and disposed under the moveable part in such a fashion as to form a pivot for said part, said pivot connecting the moveable part to the fixed part. The pivot may or may not be centered under the moveable part, depending on the applications.

According to a second embodiment of the articulation means of a micro-mirror, two articulation elements are realized and disposed on either side of the moveable part in such a fashion as to form a hinge connecting it to the fixed part.

Preferably, according to this second method, the articulation means are realized by etching the second layer; this etching may be done at the same time as that of creation of the moveable part. Naturally, hinge-type articulation means can also be realized as hereinbefore described, by epitaxy across the vias.

According to a preferred embodiment of the invention the substrate is comprised of silicon, the first layer is a thermal oxide of silicon, the second layer is monocrystalline silicon and the articulation means are comprised of monocrystalline silicon.

Advantageously, the method of the invention uses an attenuation of the second layer for reducing the inertia of the moveable parts and allows functioning of the micro-mirror at higher frequencies.

This attenuation of the second layer can be realized either by the creation of an embrittlement zone at a depth in the second layer so that the remaining thickness, after removal of the surplus (the surplus can be an intermediate substrate), corresponds to the thickness desired for the second layer, either by using a chemical etching or reactive ion step or mechanochemical polishing until obtaining the desired thickness or even a combination of all of these techniques. If the attenuation step results in excessively thin thicknesses of the second layer, this thickness can be restored in an epitaxy step.

According to an advantageous embodiment of the invention making it possible to have high angular excursion of the moveable part, at least one cavity is made in the mechanical support opposite at least one zone of one of the extremities of the moveable part by etching of the substrate according to a form and geometric dimensions that make it possible to depart from the dimensional parameters of the micro-mirror and total angular excursion $\Delta\theta$ along the axis or different axes of rotation.

The cavity or cavities of the substrate are advantageously realized by anisotropic etching, for example by wet etching or by dry processes such as ion etching or reactive ionic etching. Generally, the substrate comprises in the case of a pivoting micro-mirror a peripheral cavity opposite to a peripheral zone of the extremity of the moveable part.

According to one embodiment, the micro-mirror being electrically controlled, the method of the invention comprises a step for realization of control means by the formation of opposing electrodes on the mechanical substrate and on the moveable part.

Advantageously, if the substrate and the moveable part are at least in the facing semiconductor parts, the electrodes are formed by ionic implantation of dopants whether or not followed by suitable thermal diffusion of the dopants.

The connection lines from the electrodes to a control electronics can be realized in different ways and especially also by ionic implantation of dopants whether or not followed by suitable thermal diffusion of the dopants. These lines are realized advantageously on the face of the substrate opposite the moveable part, the electrodes of the moveable part being connected to certain of these lines advantageously by means of articulation means. In addition, connections can be provided at the ends of these lines with a view of their connection to the control electronics.

According to another embodiment, the connection lines of the different electrodes are realized by plated-through holes through the substrate; the electrodes of the moveable part being connected to certain of said plated-through holes advantageously by means of the articulation means; connectors can in addition be provided at the ends of these lines with a view of their connection to the control electronics.

The invention can also make use of electrical control means utilizing forces other than electro-static forces and, for example, electromagnetic forces or piezoelectrical forces or even thermoelastic forces. By way of example, control of the moveable parts by magnetic forces (Laplace forces) requires the realization of adapted coils and magnets for generating the necessary magnetic fields.

According to one particular embodiment of the invention, the moveable part comprises at least two parts: a first part comprising the reflection means and at least one second part surrounding the first part, the articulation means connecting said second part to the fixed part and intermediate articulation means connecting the first part of the moveable part to the second part.

The articulation means of a micro-mirror can comprise at least one hinge or a pivot. The intermediate articulation means comprise at least one hinge.

Said hinge is realized advantageously by etching of the second layer according to a suitable pattern.

According to the invention, the use of a pivot makes it possible for the moveable part to move in all directions around an axis of symmetry passing through the pivot and perpendicular to the plane of the substrate.

When the articulation means and the intermediate articulation means are formed by hinges, in general one hinge composed of 2 elements is necessary for articulating each part of the moveable part, the elements of the hinge being disposed on either part of said moveable part. Each hinge allows a displacement of the part with which it is associated around an axis passing through the elements of the hinge called the hinge axis and which is parallel to the plane of the substrate. In order to increase the degrees of freedom of the moveable part, each hinge is disposed in such a fashion that its axis describes a specific angle, generally 90° to the axis of the other hinge, in a plane parallel to the substrate.

The method of the invention is applicable as well to the realization of an individual micro-mirror and to a array of micro-mirrors; these micro-mirrors being capable of being controlled independently of each other.

The invention relates also to the micro-mirror obtained according to the hereinbefore described method as well as to an array of such micro-mirrors.

According to the invention, the term array includes the strip, which is a special case of an array, in which the elements are arranged along a single axis.

BRIEF DESCRIPTION OF THE DRAWINGS

The characteristics and advantages of the invention will be more apparent in light of the following description. This description refers to exemplary embodiments, provided by way of illustration but non-limiting. It refers in addition to the attached figures, wherein:

FIGS. 9a to 9c represent top views of different micro-mirrors of the invention showing in particular different geometries of electrodes making possible rotations about one (FIG. 9a), two (FIG. 9b) or four (FIG. 9c) axes of rotation.

DETAILED DESCRIPTION OF THE EMBODIMENTS

There are, of course, numerous alternatives making possible realization of the micro-mirrors of the invention.

We shall describe only two methods for manufacturing a micro-mirror knowing on the one hand that these methods make possible a collective formation of micro-mirrors and on the other hand that these methods are non-limiting. In addition, for the sake of simplification of the description, the case of utilization of articulation means employing a pivot has been chosen that has the advantage of enabling, using a single moveable part, rotations about a plurality of axes perpendicular to the axis of the pivot by simple modification of the geometry of the control electrodes and, by way of example, silicon has been chosen for the substrate, the second layer and the articulation means. These examples are, of course, non-limiting.

The first method is realized on a wafer while the second method is realized on two separate wafers A and B then transferred.

The first embodiment of the micro-mirror of the invention that is implemented on a wafer is illustrated in the different FIG. 2.

For this (see FIG. 2a in cross-section) a SOI (silicon on insulator) wafer is created or a wafer of this type available commercially is used.

In order to create this type of wafer, a non-doped silicon substrate 21 is used, onto which a dielectric layer 22 of thermal silica is grown. A surface monocrystalline silicon layer 20 is then deposited using any of the known deposition methods and in particular those for transferring a thin layer.

Figure 1A:
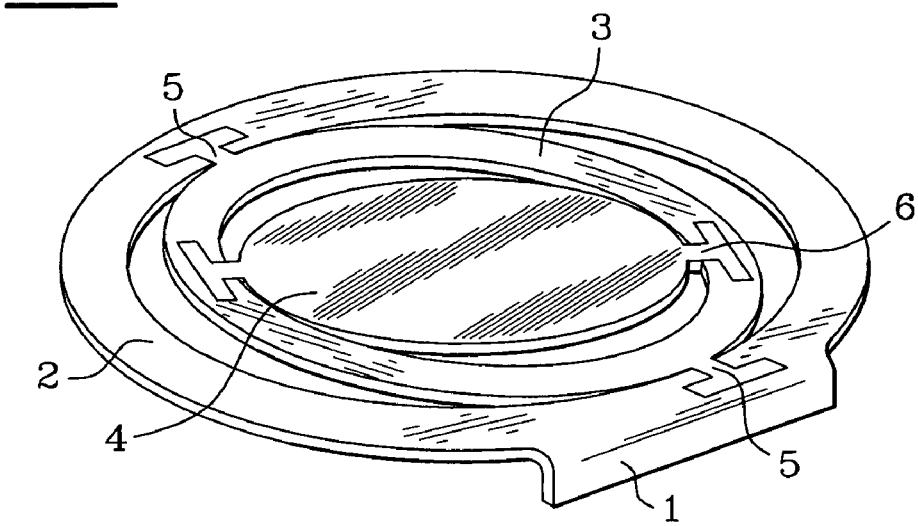
FIG. 1a–b already described, represents a hinged micromirror of the prior art that utilizes amorphous or polycrystalline materials for realizing the moveable part and the sacrificial layer.
Figure 1B:
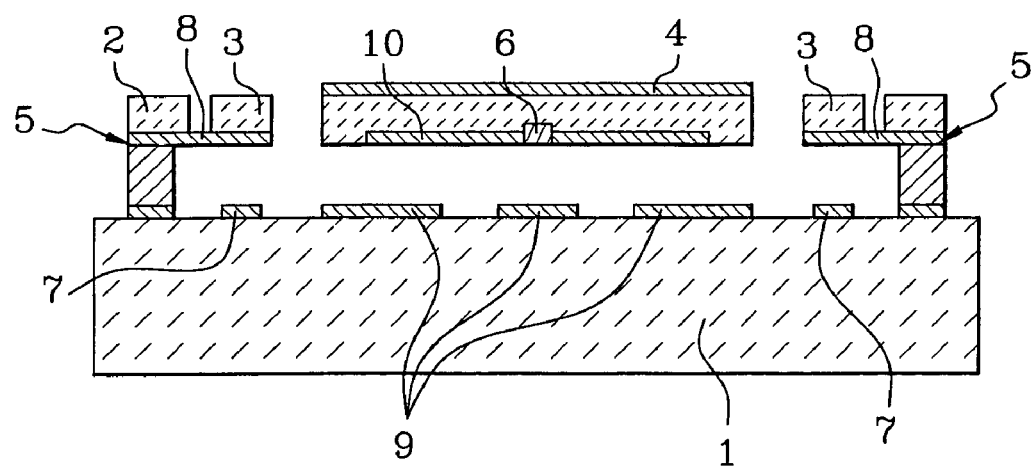
Figure 2A:
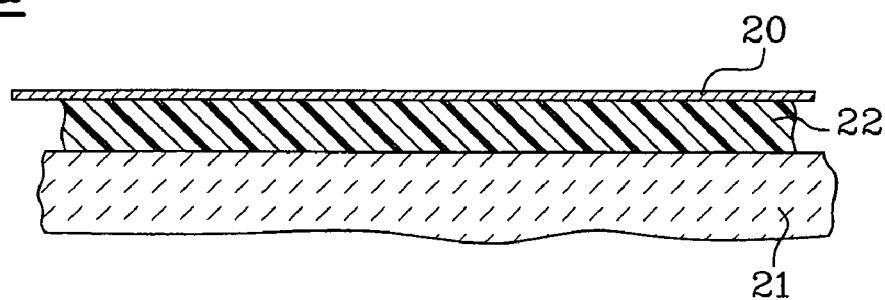
FIGS. 2a to 2i diagrammatically represent in cross-section the different steps of a first method for manufacturing a micro-mirror according to the invention.
Figure 2B:
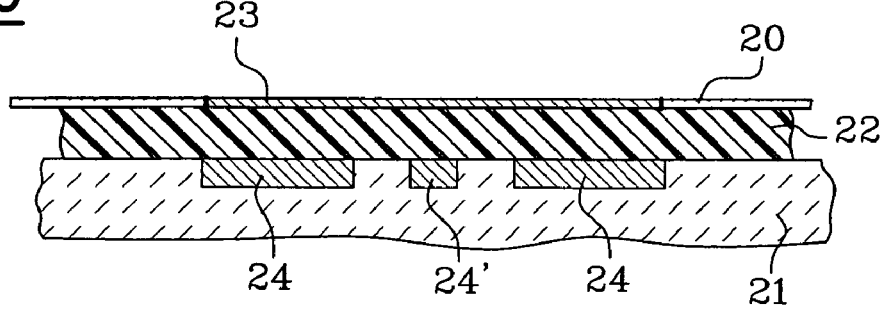

FIG. 2b represents the realization of the electrodes of the electrical control by the formation of different doped zones 24, 24', and 23 in the superior part of the non-doped silicon substrate 21 and in the monocrystalline silicon surface layer 20. These zones are obtained by ionic implantation of dopant atoms (generally boron or phosphorus) at different energies according to the desired depth of localization, whether or not followed by thermal annealing. According to the desired localization depths and the thickness of the dielectric layer 22, the implantation energies will be typically between 20 and 300 keV and the implanted doses between $10^{14}$ and $10^{16}$ cm$^{-2}$. By way of example, in the layer 20 having a thickness W' of typically between 0.1 micron and 0.6 micron, the implantation energies for forming the zones 23 will be low (15 to 100 keV); whilst in the substrate 21 the implanted ions must pass through the silica layer 22 having a thickness W and in part the silicon layer 21, the implantation energies for forming the zones 24 and 24' will be higher (generally greater than 100 keV). For a single-pattern moveable part a single doped zone 23 can suffice.

Figure 2C:
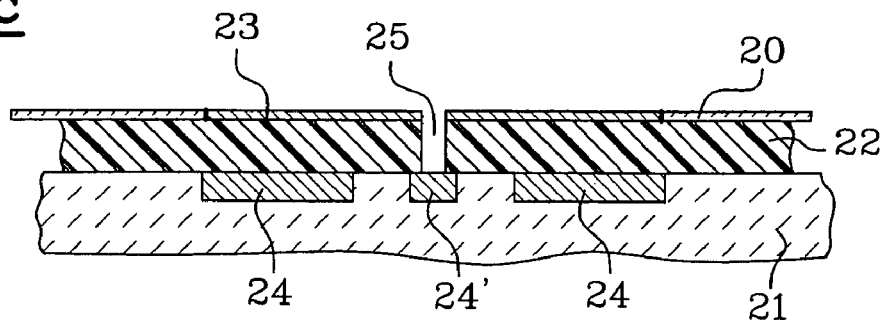

FIG. 2c represents the formation of the site 25 of the future pivot by local etching of the layers 20 and 22 in order to form a via preferably above an implanted zone 24'.

Figure 2D:
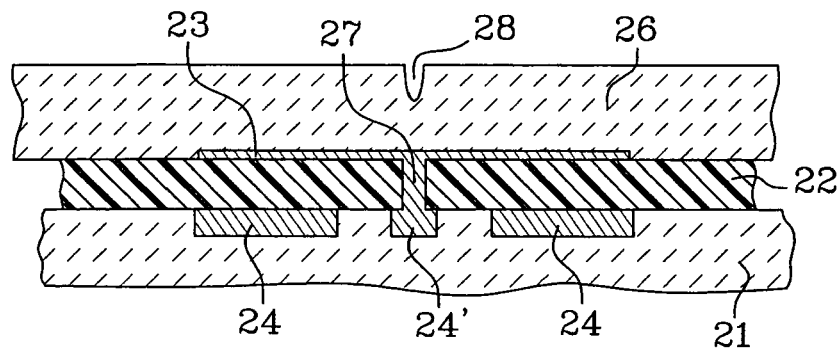

FIG. 2d represents an epitaxy step. This step makes possible at once realization of the doped monocrystalline silicon pivot and increasing the thickness of the surface silicon 20 in order to enhance the mechanical rigidity of that which will form the moveable part of the micro-mirror.

Realization of the articulation means is advantageously done using monocrystalline silicon in order to make it possible to obtain mechanically solid articulation means.

During the epitaxy step, doping of the epitaxial material can be modified and, for example, chosen to be higher at the start of the process (corresponding to the formation of the pivot 27 that is advantageously electrically connected to an implanted zone of the substrate) than at the end of the process where it is only a matter of increasing the thickness of the layer 20 for forming the monocrystalline silicon layer 26, whose thickness can attain several microns depending on the desired specifications. The depression 28 which can appear in this epitaxial layer results from the presence of the local etching 25.

Figure 2E:
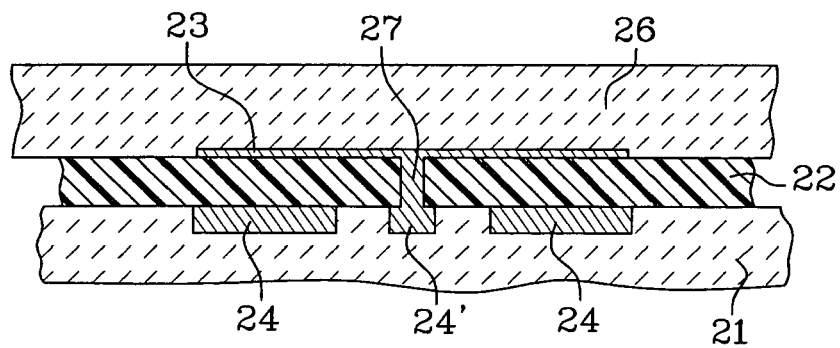

FIG. 2e represents a section of the device after the epitaxy step and attenuation, for example, by mechanochemical polishing necessary for clearing the depression 28 and obtaining a monocrystalline silicon layer 26 of perfect planeity. Other attenuation techniques can, of course, be used and in particular those described in the U.S. Pat. No. 5,374,564 or U.S. Pat. No. 6,020,252.

Figure 2F:
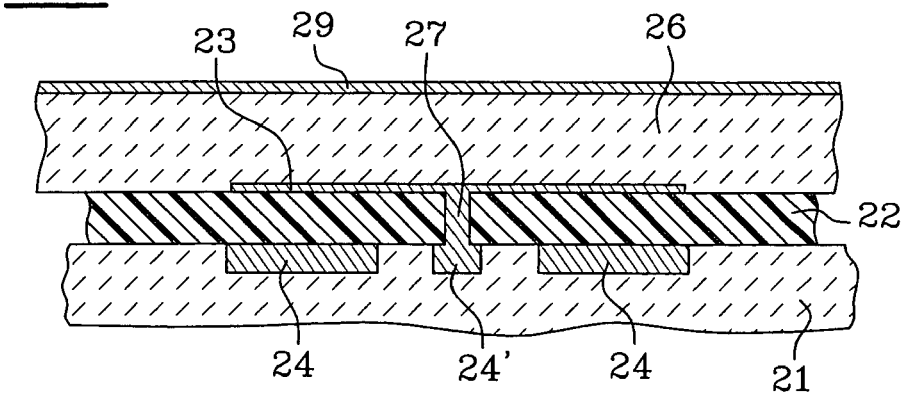

FIG. 2f represents the realization of the reflection means by the formation on the layer 26 of a high reflectivity mirror layer 29 for micro-mirror usable wavelengths, for example, by metallic or multilayer dielectric deposition.

Figure 2G:
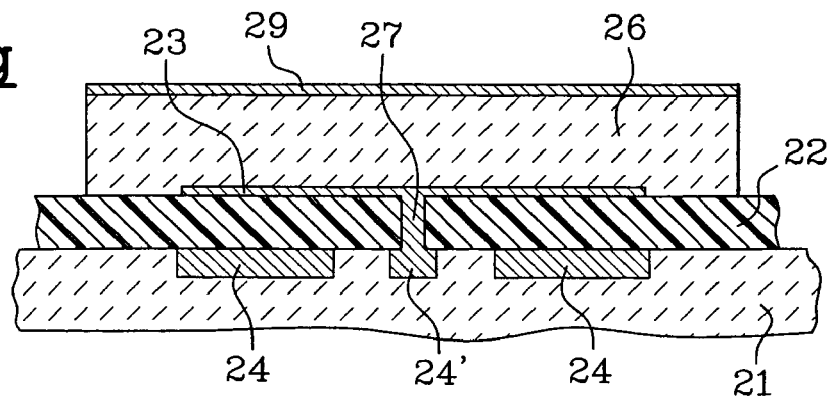

FIG. 2g represents the etching step of the future moveable part of the micro-mirror. This etching, whose geometry and dimensions depend on the expected optical specifications and thus the intended applications (for example, square sides or circle diameters of the order of several tens of microns to several millimeters), uses layers 29 and 26 and eventually the thermal silica layer 22.

This etching is done, for example, by any type of etching adapted to the materials used (ionic etching, reactive etching and/or chemical etching).

By way of example, for layers 29 of aluminum, 26 of silicon, this etching is done through a mask (not shown) by a first reactive ionic attack, for example using chlorinated gases for attacking the aluminum, then by a second reactive ionic attack, for example using an $SF_6$ gas for attacking the silicon.

Figure 2H:
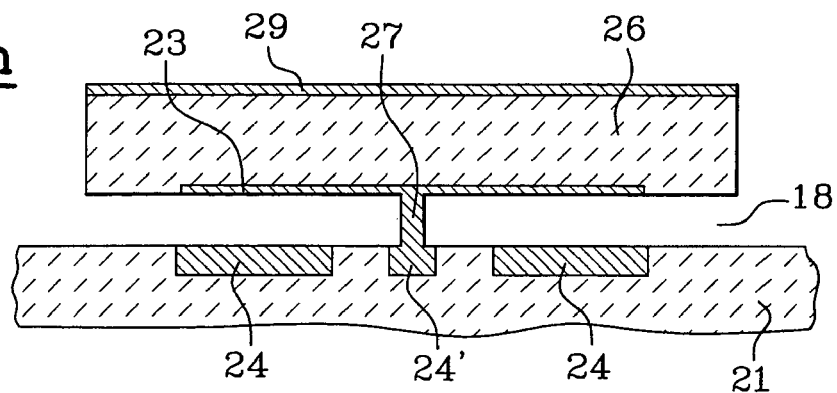

FIG. 2h represents a cross-section of the component after removal of the sacrificial silica layer 22 at least under the moveable part of the micro-mirror and hence the clearing of this moveable part. Removal of the layer 22 is done, for example, for a silicon oxide layer by chemical attack using fluorhydric acid or by reactive ionic attack using fluorinated gases.

In the structure represented in FIG. 2h, the amplitude $\Delta\theta$ of the total angular excursion is determined by the height H of the pivot and the width L of the moveable part in its plane of rotation (sine $\Delta\theta$=H/2L); the ends of the moveable part of the micro-mirror can then be situated abutting the substrate plane. This configuration thus has the drawback, for a given pivot height H, of entirely linking the total angular excursion Δθ and the dimension L of the moveable part in the plane of rotation considered.

Figure 2I:
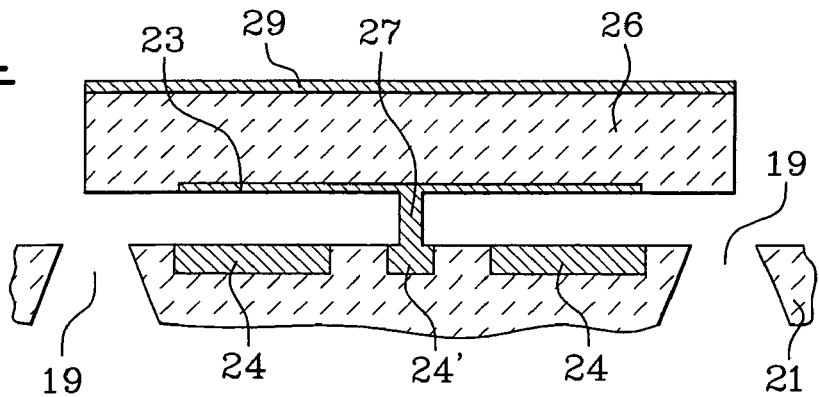

FIG. 2i provides a means for averting this drawback by creating cavities 19 in the support 21 whether crossing or not, whose inside borders are situated at a distance L' from the axis of pivot less than L/2 and the outside borders at a distance L" greater than L/2.

The angular excursion Δθ defined by the relation tangent Δθ=H/L' does not depend then on L' and not on L.

This cavity can be easily realized using the posterior surface of the wafer, for example by chemical etching preferably as illustrated in FIG. 2i and consequently must cross the thickness of the silicon substrate.

The second embodiment of the invention that carries out the steps of the method on two wafers A and B then which transfers these wafers is represented in FIGS. 3, 4, 5.

Preparation of the A Wafer

Figure 3A:
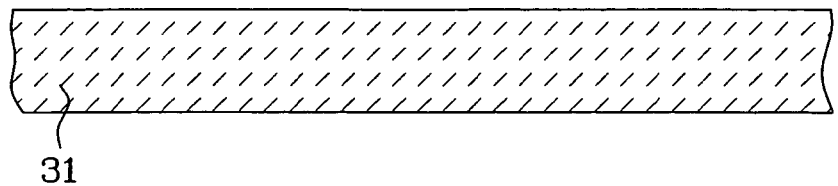
FIGS. 3a to 3g diagrammatically represent in cross-section the different steps of a second method for manufacturing the fixed part of a micro-mirror according to the invention.
Figure 3B:
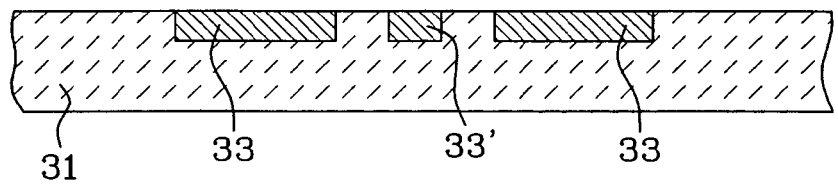
Figure 3C:
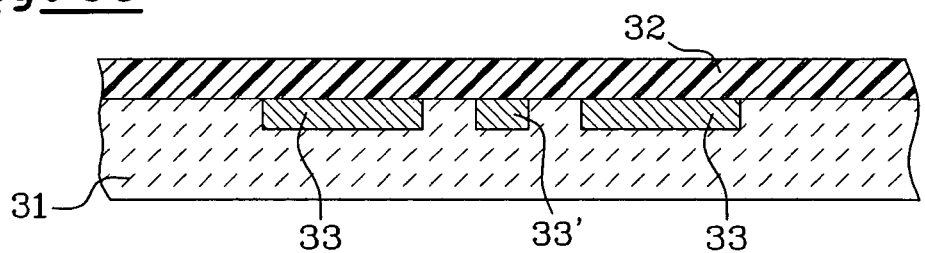

Using a mechanical support, for example an undoped silicon wafer 31 (FIG. 3a), the different electrodes 33, 33' of the fixed part is realized by ion implantation of dopants whether or not followed by thermal annealing (FIG. 3b). FIG. 3c represents a thermal oxidation step of the substrate for forming a thermal oxide layer 32 of a perfectly controlled thickness and generally between 1 and 3 microns; in the course of this step done generally at high temperature, there is a diffusion of the dopants from the implanted zones and an increase of the volume occupied by these zones.

The steps represented in FIG. 3b and FIG. 3c can be reversed at the cost of augmentation of the implantation energies for realizing the doped zones 33 and 33' (the ions implanted prior then cross the thermal silica layer).

Figure 3D:
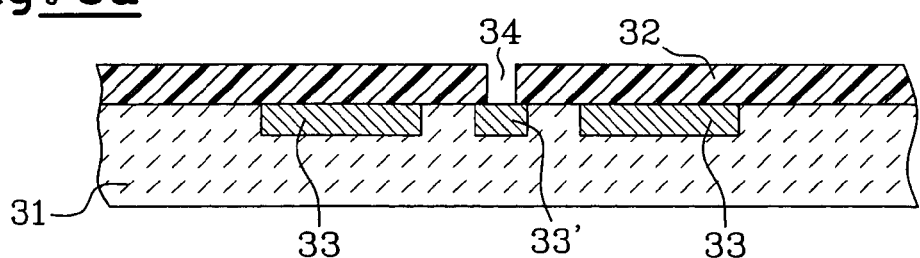
Figure 3E:
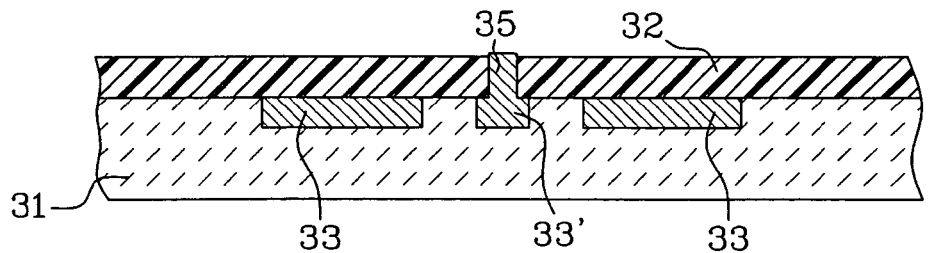
Figure 3F:
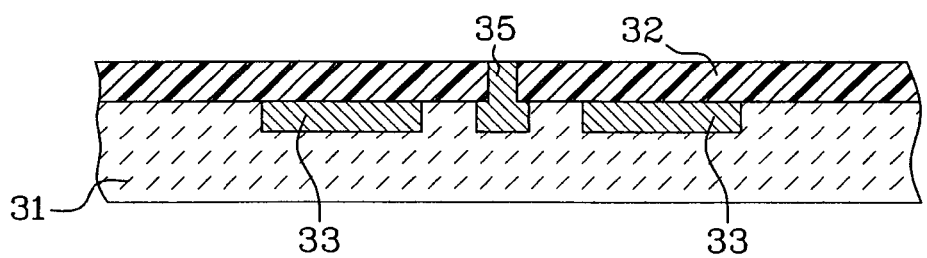

FIG. 3d represents the following step corresponding to the local etching 34 of the thermal silica layer 32 on top of the doped zone 33' for forming a via. Then, FIG. 3e represents an epitaxy step of the substrate that makes it possible to grow doped monocrystalline silicon in the via 34. The part of the articulation element 35 thus formed is of a thickness generally very slightly greater than the thick ness of the silica layer 32; this part of the element will constitute one part of the future pivot. FIG. 3f represents a mechanochemical polishing step intended to smooth the surface of the wafer A and "erase" any excess thickness from the articulation element 35.

Figure 3G:
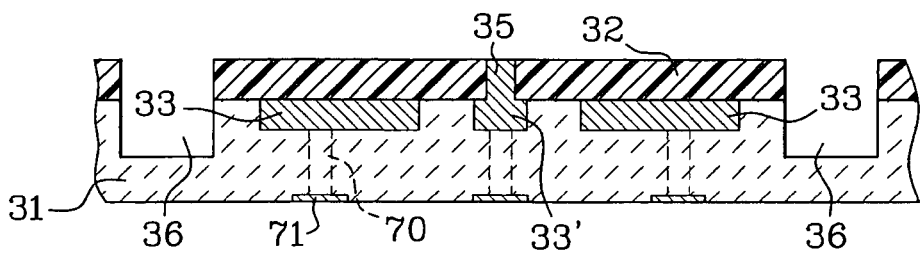

FIG. 3g represents a cavity 36 etching step that makes it possible to depart form the dimensions of the moveable part and the maximal angular excursion Δθ of said part. The dimensions (position relative to the axis of the future pivot, width and depth) of the openings 36 are determined using the dimensions of the moveable part and of the desired angular excursion Δθ along the different axes of rotation.

Contrary to the case, wherein the method of the invention is realized using one wafer and wherein the cavities 19 must cross the substrate, in this second embodiment, wherein the method is realized using two wafers that are then transferred, the cavities 36 can have a thickness much less that the thickness of the substrate 31. These cavities can be of any shape.

Preparation of the B Wafer

FIG. 4 represent the different steps for manufacturing the B wafer. First of all, a substrate 41 (FIG. 4a), for example made of monocrystalline silicon, is used in which an electrode 43 is formed, for example by ionic implantation of dopants (FIG. 4b), whether followed or not by thermal annealing. Then, a thermal oxide layer 42 (FIG. 4c) is formed in the same fashion as for the layer 32. This layer 42 is then etched to form a via 44 (FIG. 4d) that extends up to the electrode 43; this opening has dimensions very close to those of the opening 34 (FIG. 3d); an epitaxy step (FIG. 4e) using monocrystalline silicon then makes it possible to form in the opening 44 another part of the articulation element that is made of doped monocrystalline silicon 45. A mechanochemical polishing step (FIG. 4f) allows, if necessary, obtaining a perfect smoothness of the surface of the B wafer.

Figure 4A:
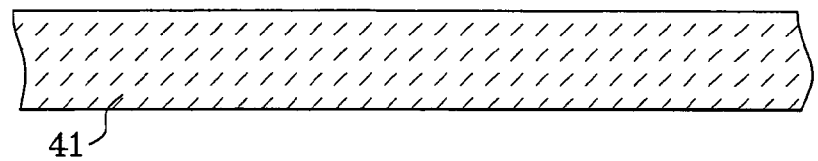
FIGS. 4a to 4g diagrammatically represent in cross-section the different steps of a second method for manufacturing the moveable part of a micro-mirror according to the invention.
Figure 4B:
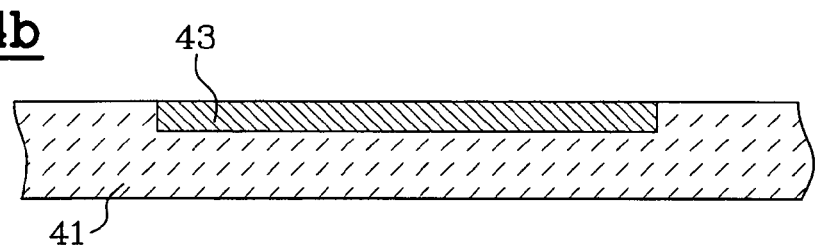
Figure 4C:
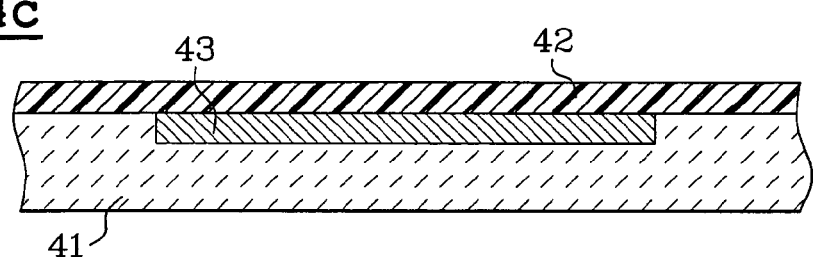
Figure 4D:
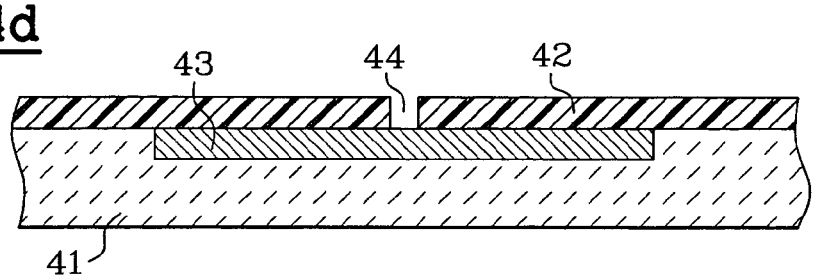
Figure 4E:
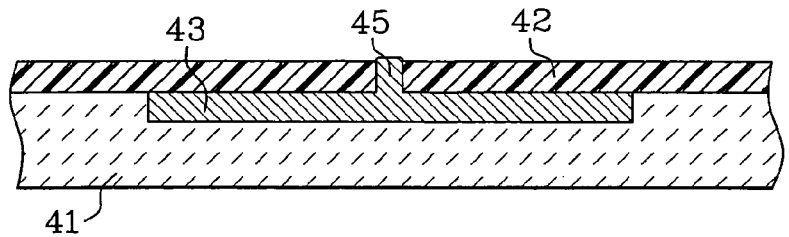
Figure 4F:
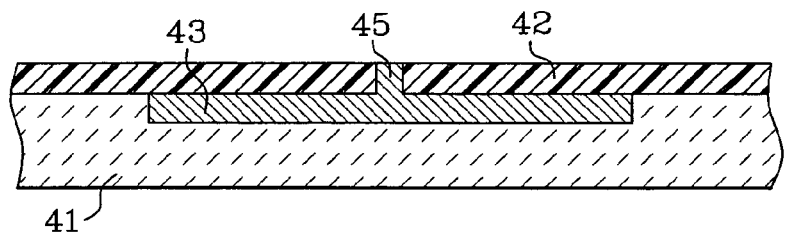
Figure 4G:
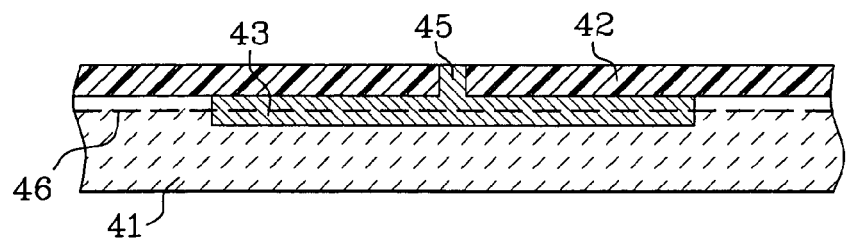

The step illustrated in FIG. 4g consists of creating a liaison zone 46 in the wafer 41 such as an embrittlement zone created, for example, by ion implantation. This zone delimits in the wafer a layer (hereinbefore called the second layer) of a thickness of typically between 0.1 and 2 microns between the silica layer 42 and the rest of the wafer (which can be an intermediate substrate). This embrittlement zone makes it possible to separate the second layer from the rest of the wafer, either before transfer but more generally after transfer (see in particular the U.S. Pat. No. 5,374,564 and U.S. Pat. No. 6,020,252).

Assembly of the A and B Wafers

Figure 5A:
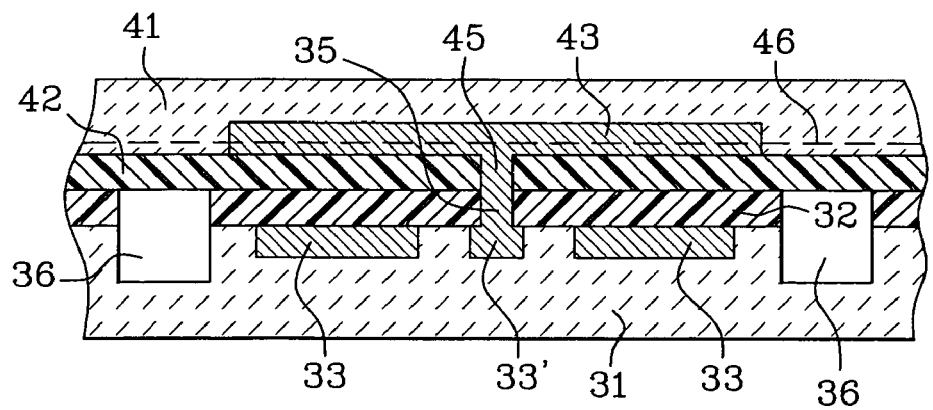
FIGS. 5a to 5e diagrammatically represent in cross-section the different steps making possible, after transfer of the structures obtained in FIGS. 3g and 4g, realization of a micro-mirror according to this second mode.
Figure 5B:
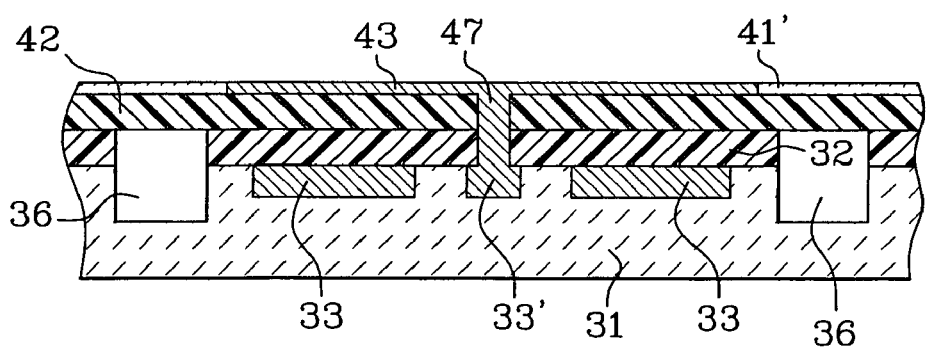
Figure 5C:
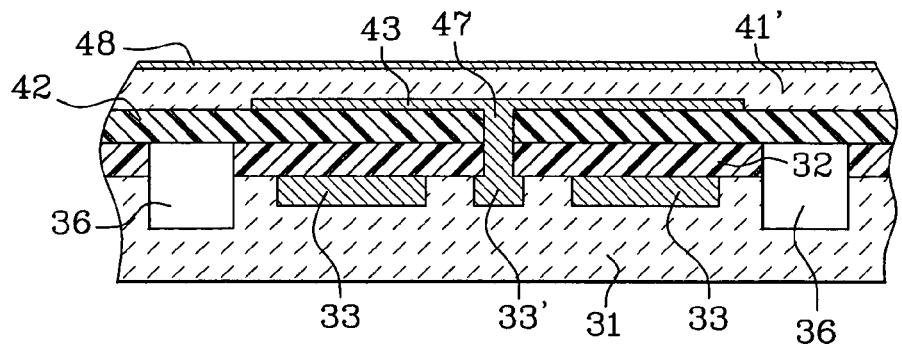

The first step represented in FIG. 5a consists of assembling the two wafers A and B, oxidized face against oxidized face. During this assembly, the positioning of the two wafers is realized so as to align the two articulation elements 35 and 45 and form a single element 47 which will be the future pivot.

Sealing can advantageously be done by the known molecular adhesion techniques.

The two wafers A and B being assembled, the superior part of the layer 41 of the B wafer is separated from the A and B assembly at the level of the embrittlement zone 46. This separation can advantageously be done using a thermal and/or mechanical treatment. After this separation, there remains only (see FIG. 5b) a thin layer of monocrystalline silicon 41' eventually comprising zones of different dopings.

If the layer 41' is too thin, the method can in addition comprise (see FIG. 5c) an epitaxy step for increasing the thickness of the monocrystalline film 41' in order to increase the mechanical rigidity of same which will form the moveable part of the mirrors; this step may be followed by a mechanochemical polishing step for planarizing the surface. The final thickness of this layer 41' is, for example, 5 to 60 µm.

A layer 48 of high reflectivity of the working optical wavelengths either metallic or dielectric multilayer is then deposited on the layer 41'.

Figure 5D:
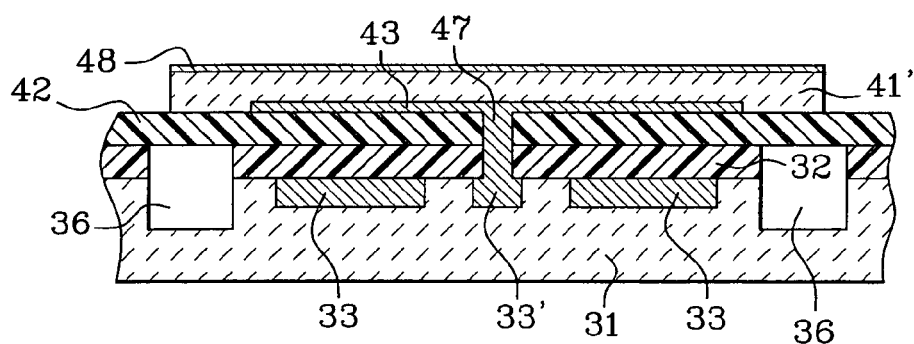

FIG. 5d represents the following etching step of the layers 41' and 48 according to the desired pattern for the mobile part of the future micro-mirror. This etching is done over a mask (not shown).

Figure 5E:
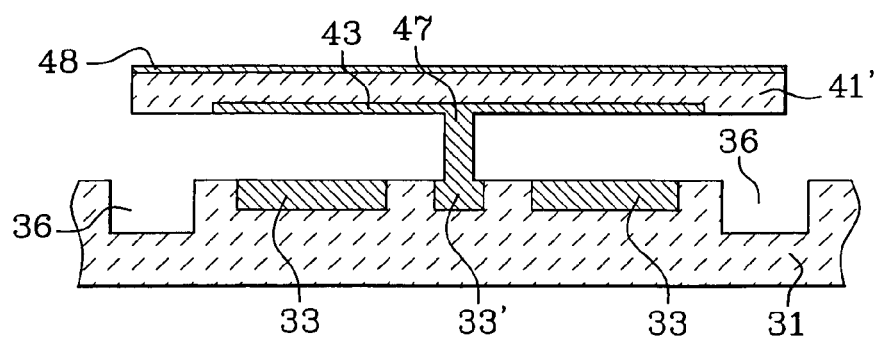

FIG. 5e represents the step of clearing the moveable part around the pivot 47 by suppression of the sacrificial layers of thermal silica by chemical attack as described for FIG. 2h, for example.

The different manufacturing steps presenting in the various FIGS. 2 to 5 can comprise numerous alternatives. In particular, the order of the different steps can, in certain cases, be reversed and certain of the steps can be modified.

Thus, for example, a single thermal oxidation layer could be realized on the A wafer and thus form the pivot using a single element in this layer; the monocrystalline silicon layer would be transferred directly onto this oxide layer.

Likewise, in lieu of creating a pivot, two articulation elements (in one part or in two parts, respectively) could be created in the thermal oxide in such a fashion as to form a hinge; in this instance, the articulation elements are preferably disposed on either side of the moveable part and between it and the fixed part.

The moveable part could also have been realized in two parts as in the prior art and an intermediate hinge formed by etching using appropriate patterns of the monocrystalline silicon layer.

In order to simplify the description, the connection lines of the electrodes and the contacts to the control electronics are not represented in the previous figures.

These connection lines can be realized in different ways and in particular by ionic implantation of dopants, whether or not followed by thermal diffusion appropriate to the dopants. These lines are realized advantageously on the front face of the support opposite to the moveable part, the electrode or electrodes of the moveable part being connected to certain of these lines advantageously by means of the articulation elements. These connection lines can also be realized by plated-through holes across the substrate, the electrode or electrodes of the moveable part being connected to certain of these plated-through holes advantageously by means of the articulation elements.

By way of example, FIG. 3g only represents in dotted lines the realization across the substrate of the plated-though holes 70 connecting the electrodes 33 and 33' to contacts 71.

When the micro-mirror must turn about at least two perpendicular axes of rotation while preserving the advantage of separating the value of angular excursion $\Delta\theta$ from the dimension L of the moveable part, cavities completely surrounding the pivot 47 are advantageously realized in the substrate. In the case, wherein the connection lines are realized on the front face of the substrate, in order not to be cut by the cavities, the electrical connection lines (represented by way of example in FIG. 9 and designated by 60) supplying the different electrodes, the substrate is etched in order form there a peripheral cavity prior to forming the doped zones 33, 33'.

FIG. 6 represent this alternative of the method.

Using a wafer 31 (see FIG. 6a), a cavity 36 is formed by etching done by different methods such as reactive ionic etching (corresponding to the shape of the cavity of FIG. 3g), wherein the preferred chemical etching (corresponding to the shape of the cavity of FIG. 6b) of the cavity 36 is determined using the shape (which can be circular, square, rectangular, octagonal, etc.) and dimensions of the moveable part of the micro-mirror and the value of the total angular excursion $\Delta\theta$ desired along the different axes of rotation; the value of the total angular excursion $\Delta\theta$ being otherwise capable of assuming different values $\Delta\theta_1$, $\Delta\theta_2$, etc. along each of the axes of rotation.

Figure 6A:
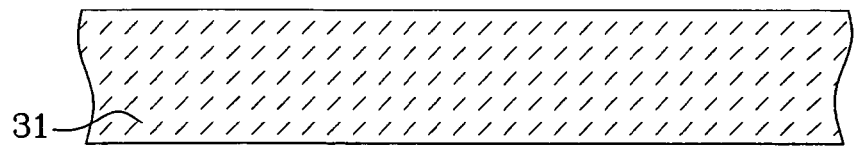
FIGS. 6a to 6g diagrammatically represent in cross-section the different steps of a third manufacturing method of the fixed part of a micro-mirror according to the invention.
Figure 6B:
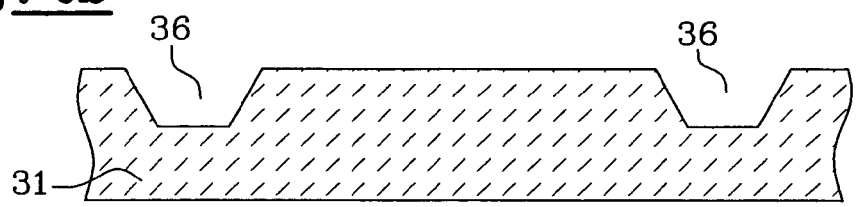
Figure 6C:
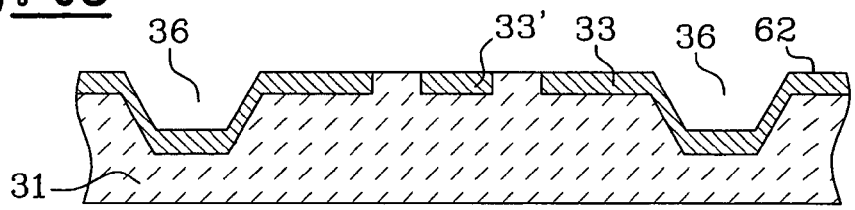
Figure 6D:
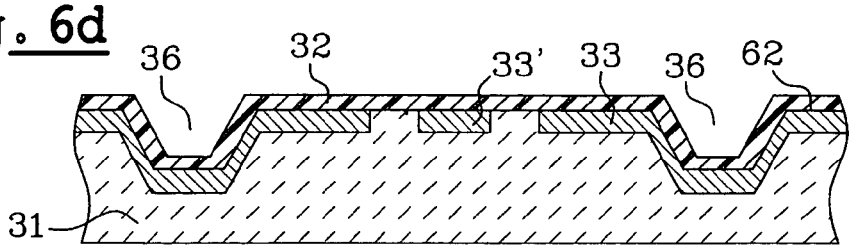
Figure 6E:
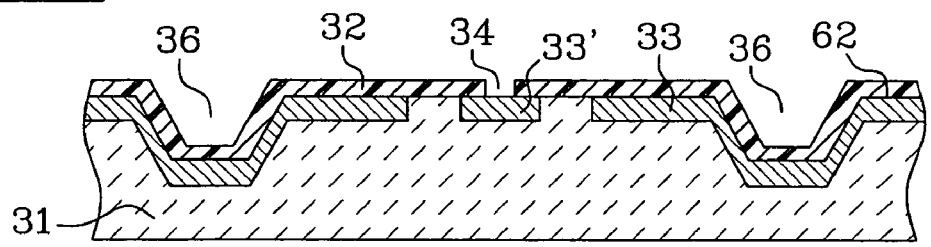
Figure 6F:
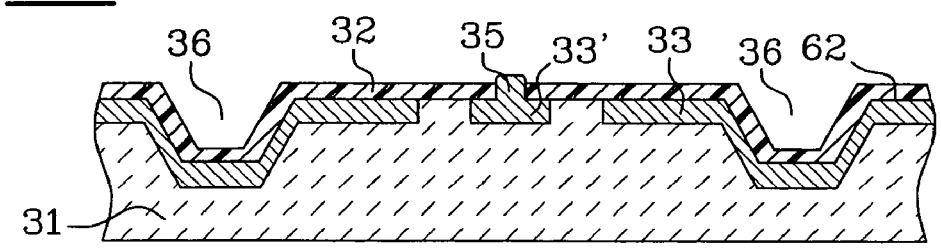
Figure 6G:
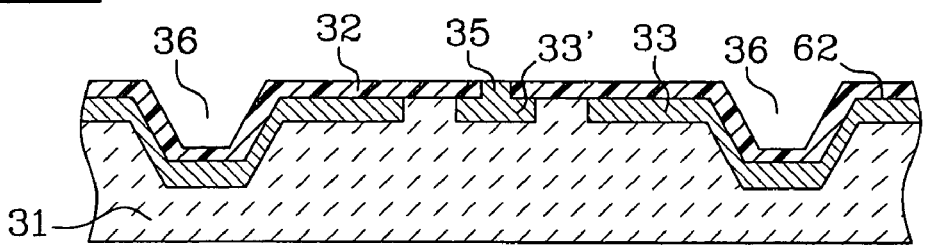

The other manufacturing steps are represented in FIG. 6c (realization of the doped zones), FIG. 6d (realization of the thermal oxide), FIG. 6e (realization of a via 34 in the oxide layer), FIG. 6f (epitaxy for realizing the pivot part), and FIG. 6g (planarization of the structure) can be identical to those previously described. In order to obtain the final structure, it is then transferred onto the wafer obtained in FIG. 6g, for example the wafer obtained FIG. 4g and, as described with reference to FIG. 5, the rest of the steps of the method are carried out. The micro-mirror obtained is represented in FIG. 7.

Figure 7A:
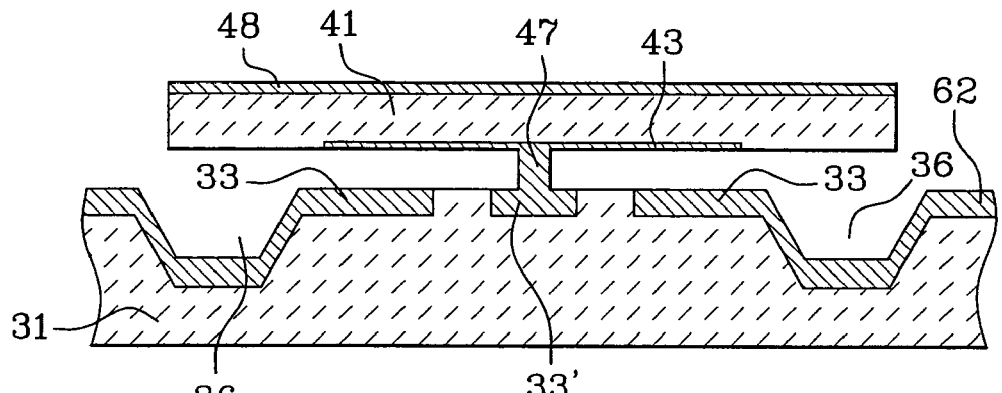
FIGS. 7a to 7c diagrammatically represent in cross-section different positions of a moveable part connected to the fixed part by means of a pivot.
Figure 7B:
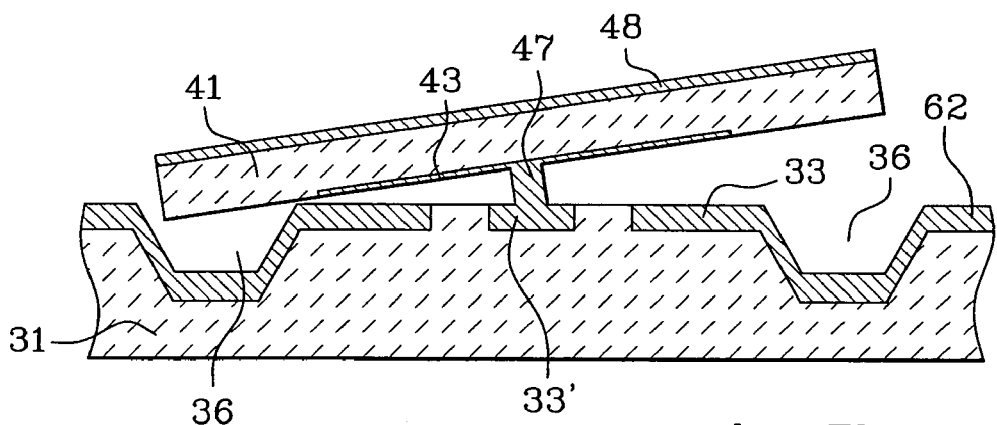
Figure 7C:
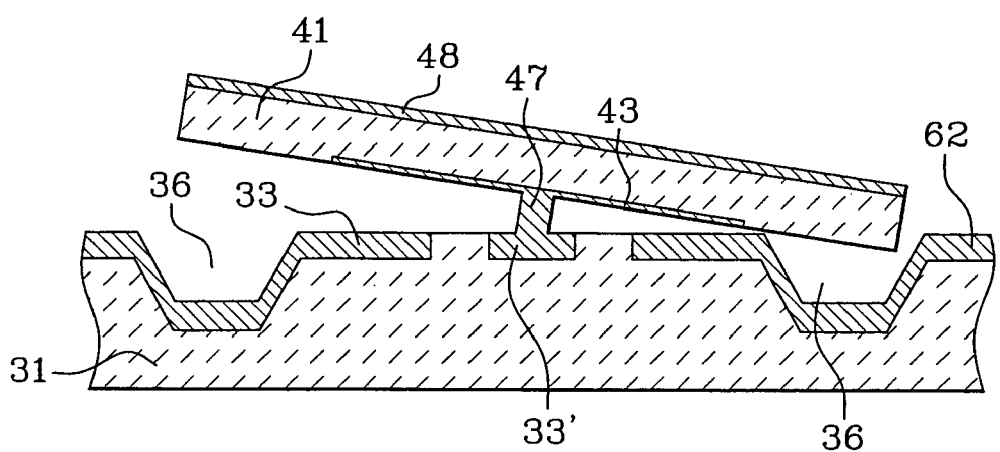

Three examples of positions of the moveable part of the pivot micro-mirror are represented respectively in FIGS. 7a, 7b, 7c.

FIG. 7a represents the moveable part disposed in a plane parallel to the plane of the substrate; FIG. 7b represents the moveable part that has pivoted on an axis of rotation perpendicular to that of the pivot and perpendicular to the plane of the figure; one of the ends of the moveable part is situated in the cavity 36; FIG. 7c represents the moveable part that has pivoted about the same axis of rotation but at 180°, the opposing end of the moveable part is situated in turn in the cavity 36.

Figure 8A:
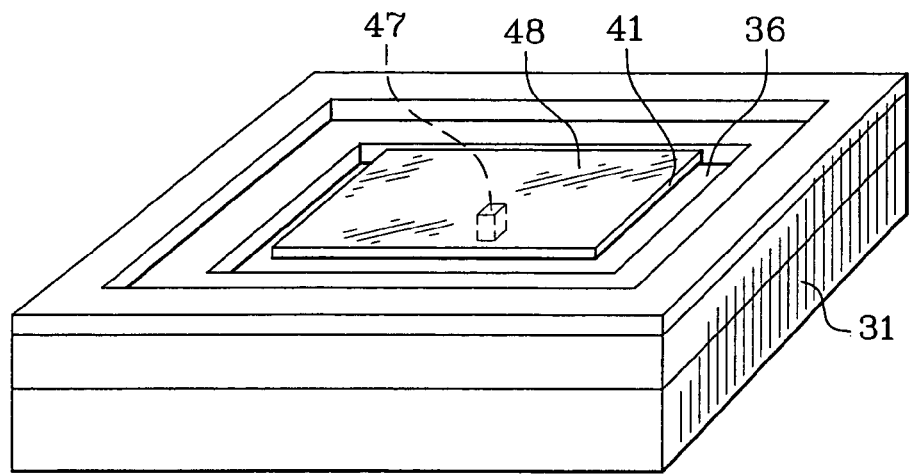
FIGS. 8a and 8b, respectively, provide an overall perspective of an example of pivot micro-mirror and an example of a simple hinged micro-mirror according to the invention.
Figure 8B:
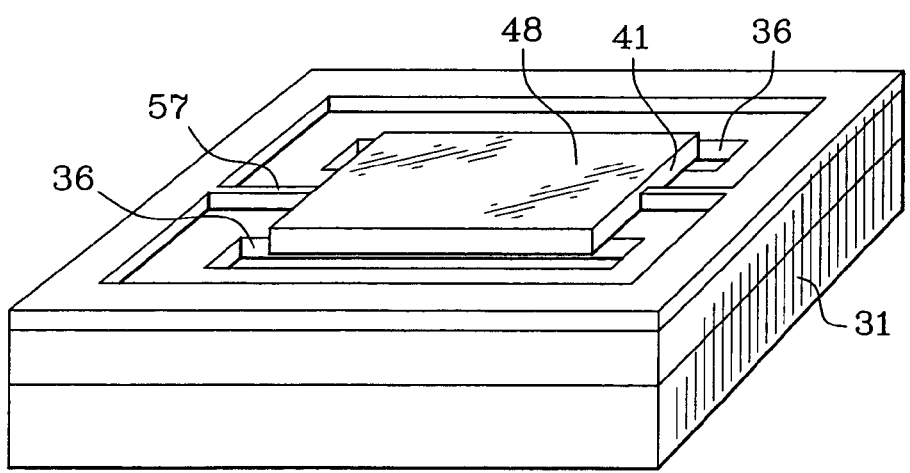

FIG. 8a provides a diagrammatic view in perspective of a pivot micro-mirror 47 and FIG. 8b diagrammatically represents a perspective view of a simple hinged micro-mirror 57, in this example said hinge being realized by etching of the second layer.

As mentioned above, the advantage of the pivot micro-mirrors for certain applications is that of making possible, in virtue of a convenient configuration of electrodes but without modification of the principal manufacturing steps, swinging along several axes of rotation and in particular along two perpendicular axes.

Figure 9A:
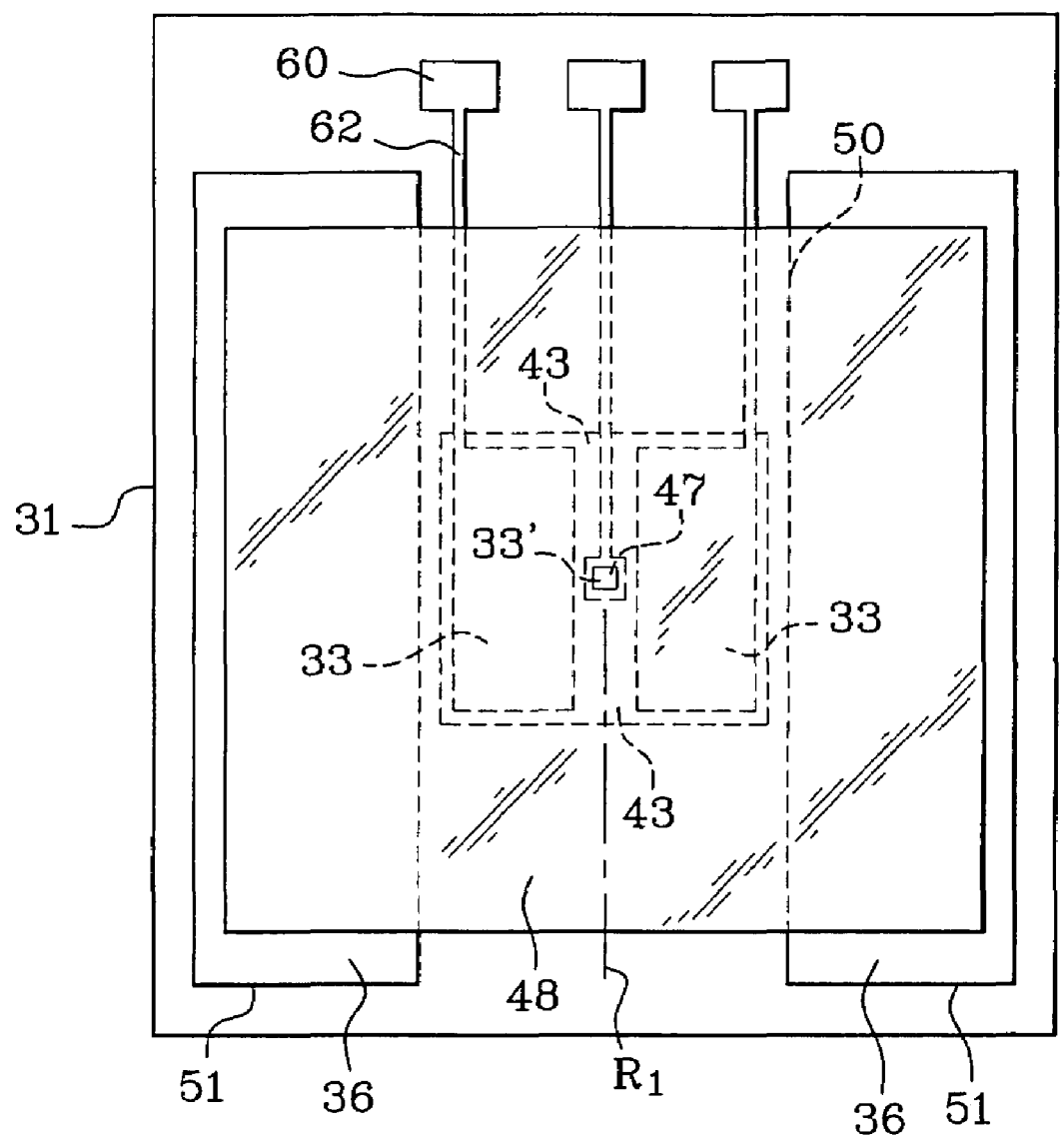

FIG. 9a represents a top view of a layout of electrodes in the fixed part. The electrodes 33 making it possible to swing the moveable part along 2 positions about one single axis of rotation R1 are two in number and are disposed symmetrically relative to the axis of rotation R1 that passes through the pivot 47; the central electrode 33' enables, together with the pivot, the electrical connection of the electrode of the moveable part.

FIG. 9b represents an electrode geometry 33 enabling obtaining 4 positions about 2 perpendicular axes of rotation R1 and R2 passing through the pivot; these electrodes 33 are 4 in number and are paired 2 by 2, each electrode couple being disposes symmetrically relative to one of the axes; likewise, the central electrode 33' enables together with the pivot the electrical connection of the electrode of the moveable part. Thus, a large number of electrode couples 33 disposed on either side of an axis of symmetry can be envisaged. FIG. 9c provides an example of 4 axes of rotation (R1, R2, R3, R4) at 45° to each other and 4 electrode couples 33 disposed in sectors around the axis of the pivot.

FIGS. 9a, 9b, and 9c represent in transparency the different key elements of the micro-mirror. The sets of bottom electrodes 33 (electrodes of the fixed part) and the top electrode 43 (electrode of the moveable part) are represented; the bottom electrode 33' that is electrically connected to the top electrode by the pivot 47 is drawn in dark gray while in FIG. 9b the two sets of electrodes enabling control of the rotation of the micro-mirror along each of the perpendicular axes of rotation are drawn using two shades of lighter but different grays. The reflecting surface 48 of the moveable part and the tracks 50 and 51 of the etched zones 36 make possible the separation of the variable dimensions of the micro-mirror and total angular excursion $\Delta\theta$ are also represented.

Also very diagrammatically represented are the connection lines 62 of the electrodes to the contacts 60; these contacts being capable of being connected to a control electronics (not shown).

The different aforementioned functionalities are can, of course, be realized in the case of utilization of a single wafer and several wafers. However, the method utilizing at least two wafers makes possible more possibilities. The utilization of more than two wafers can make possible in particular the realization of more complex structures and particularly the realization of several superimposed moveable parts, one over the others, by means of articulation means; at least, the last moveable part comprising reflector means. The superpositioning of these moveable parts in the planes parallel to the substrate makes it possible to have a micro-mirror with still greater degrees of freedom. The method of the invention is in fact applied to this type of structure, in considering that each moveable part is realized successively over a substrate tat can then be either a moveable part realized prior or the first substrate corresponding to the fixed part.

References

"Mirrors on a chip", IEEE SPECTRUM, November 1993
L. J. Hornbeck, "Micro-machining and micro-fabrication" "95", October 1995, Austin (US)
D. J. Bischop and V. A. Aksyk, "Optical MEMS answer high-speed networking requirements", Electronic Design, 5 Apr. 1999.

What is claimed is:

1. A method for manufacturing an optical micro-mirror including a fixed part and a moveable part connected to the fixed part by an articulation mechanism, the moveable part including a reflector, the method comprising:
   a) forming a stack formed of a mechanical substrate, a sacrificial layer of a specific thickness of thermal oxidation material as a first layer, and an assembly for forming the moveable part and including at least one layer of material as a second layer;
   b) forming the articulation mechanism;
   c) forming the moveable part by etching of at least the second layer of material to obtain at least one pattern; and
   d) removing at least in part the sacrificial layer for clearing the moveable part that is then connected to a rest of the micro-mirror corresponding to the fixed part using the articulation mechanism, wherein:
   the step a) of forming the stack comprises transferring onto the mechanical substrate the second layer, the substrate and/or the second layer including on their faces to be transferred a thermal oxidation layer that will form the first layer after the transferring.

2. The method according to claim 1, wherein the reflector is formed on the second layer by deposition of reflector material in monolayer or multilayers.

3. The method according to claim 1, wherein the sacrificial layer comprised of thermal oxidation material has a thickness greater than or equal to 1 micron.

4. The method according to claim 1, wherein the second layer is a layer of monocrystalline material.

5. The method according to claim 1, wherein the transferring comprises sealing by molecular adhesion.

6. The method according to claim 1, wherein the second layer can be combined with an intermediate substrate using a communication zone capable of enabling removal of the intermediate substrate.

7. The method according to claim 1, wherein the articulation mechanism is formed prior to the removing d) by localized etching of layers disposed on top of the substrate to form at least one via and by epitaxy across each via, epitaxial material in each via forming wholly or in part an articulation element of the articulation mechanism.

8. The method according to claim 1, wherein the articulation mechanism is formed by:
   localized etchings prior to the transferring, to form at least a first via in the layer or layers disposed on top of the substrate and to form at least a second via in the layer or layers disposed on the second layer and that will be facing the substrate;
   epitaxy across the first via forming a first part of an articulation element and epitaxy in the second via forming a second part of the articulation element, the first and second parts opposing during the transferring and forming after the transferring an articulation element of the articulation mechanism.

9. The method according to claim 7, wherein for forming the articulation mechanism of a micro-mirror, one single element of articulation is formed and disposed under the moveable part to form a pivot for the moveable part, the pivot linking the moveable part to the fixed part.

10. The method according to claim 1, wherein for forming the articulation mechanism of a micro-mirror, two articulation elements are formed and disposed on either side of the moveable part to form a hinge connecting the moveable part to the fixed part.

11. The method according to claim 1, wherein the articulation mechanism is formed by etching the second layer.

12. The method according to claim 1, wherein the substrate is made of silicon, the first layer is a thermal oxide of silicon, the second layer is comprised of monocrystalline silicon, and the articulation mechanism is comprised of monocrystalline silicon.

13. The method according to claim 1, further comprising e) attenuating the second layer.

14. The method according to claim 1, further comprising e) forming in the mechanical substrate at least one cavity facing at least one part of one of ends of the moveable part.

15. The method according to claim 14, wherein the at least one cavity of the substrate is formed by anisotropic etching.

16. The method according to claim 1, wherein the micro-mirror is electrically controlled, and further comprising e) realizing a control device by formation of facing electrodes on the substrate and on the moveable part.

17. The method according to claim 16, wherein when the substrate and the moveable part are at least in facing semiconductor materials parts, the electrodes are formed by ionic implantation of dopants, whether or not followed by thermal diffusion appropriate to the dopants.

18. The method according to claim 17, wherein connection lines of the electrodes to the control device are formed by ionic implantation of dopants followed by appropriate thermal diffusion of the dopants, the connection lines are formed on a face of the substrate facing the moveable part, the electrode or electrodes of the moveable part being connected to one or plural of the connection lines by the articulation mechanism, contacts being in addition provided at ends of the connection lines with a view of their connection to the control device.

19. The method according to claim 16, wherein connection lines of the electrodes to the control device are formed by plated through holes across the substrate, the electrode or electrodes of the moveable part being connected to one or a plurality of the plated-through holes by the articulation mechanism, contacts being in addition provided at ends of the connection lines with a view of their connection to the command electronics.

20. The method according to claim 1, wherein the moveable part comprises at least first and second parts, the first part comprising the reflector and at least one second part surrounding the first part, the articulation mechanism connecting the second part to the fixed part and an intermediate articulation mechanism connecting the first part of the moveable part to the second part.

21. The method according to claim 20, wherein the intermediate articulation device mechanism a hinge.

22. The method according to claim 21, wherein the intermediate articulation mechanism is formed by etching of the second layer.

23. The method according to claim 1, applied to formation of an array of micro-mirrors.

24. The micro-mirror or array of micro-mirrors obtained according to the method defined according to claim 1.

25. A method for manufacturing an optical micro-mirror including a fixed part and a moveable part connected to the fixed part by an articulation mechanism, the moveable part including a reflector, the method comprising:
- forming a stack comprising a mechanical substrate, a sacrificial layer of thermal oxidation material, and an assembly layer for forming the moveable part;
- forming the articulation mechanism;
- forming the moveable part by etching in the assembly layer to obtain at least one pattern; and
- removing at least in part the sacrificial layer for clearing the moveable part that is then connected to a rest of the micro-mirror corresponding to the fixed part using the articulation mechanism, wherein:
- the step of forming the stack further comprises forming at least one thermal oxidation layer on the assembly layer, wherein the step of forming the stack further comprises transferring onto the mechanical substrate said at least one thermal oxidation layer that will form the sacrificial layer after the transferring.

26. The method for manufacturing an optical micro-mirror according to claim 25, wherein the step of forming the stack further comprises forming at least one thermal oxidation layer on the substrate.

27. The method for manufacturing an optical micro-mirror according to claim 25, wherein the step of forming the stack further comprises forming at least two thermal oxidation layers.

28. The method for manufacturing an optical micro-mirror according to claim 27, wherein the step of forming the stack further comprises transferring the substrate onto the assembly layer oxidized face to oxidized face.

29. A method for manufacturing an optical micro-mirror including a fixed part and a moveable part connected to the fixed part by an articulation mechanism, the moveable part including a reflector, the method comprising:
- forming a stack comprising a mechanical substrate, a sacrificial layer of a specific thickness of thermal oxidation material as a first layer, and an assembly for forming the moveable part and including at least one layer of material as a second layer;
- forming the articulation mechanism;
- forming the moveable part by etching of at least the second layer of material to obtain at least one pattern;
- removing at least in part the sacrificial layer for clearing the moveable part that is then connected to a rest of the micro-mirror corresponding to the fixed part using the articulation mechanism; and
- forming in the mechanical substrate at least one cavity facing at least one part of one of ends of the moveable part.

* * * * *